(12) United States Patent
Hashimoto

(10) Patent No.: US 8,558,560 B2
(45) Date of Patent: *Oct. 15, 2013

(54) TEST APPARATUS, ADDITIONAL CIRCUIT AND TEST BOARD FOR JUDGMENT BASED ON PEAK CURRENT

(75) Inventor: Yoshihiro Hashimoto, Saitama (JP)

(73) Assignee: Advantest Corporation, Tokyo (JP)

( * ) Notice: Subject to any disclaimer, the term of this patent is extended or adjusted under 35 U.S.C. 154(b) by 481 days.

This patent is subject to a terminal disclaimer.

(21) Appl. No.: 12/876,057

(22) Filed: Sep. 3, 2010

(65) Prior Publication Data

US 2011/0018549 A1    Jan. 27, 2011

Related U.S. Application Data

(63) Continuation of application No. PCT/JP2010/001333, filed on Feb. 26, 2010, which is a continuation-in-part of application No. PCT/JP2009/003482, filed on Jul. 23, 2009, which is a continuation-in-part of application No. 12/603,350, filed on Oct. 21, 2009, now Pat. No. 8,164,351.

(51) Int. Cl.
*G01R 27/26* (2006.01)

(52) U.S. Cl.
USPC ....... 324/678; 324/705; 324/713; 324/762.01

(58) Field of Classification Search
None
See application file for complete search history.

(56) References Cited

U.S. PATENT DOCUMENTS

| | | | |
|---|---|---|---|
| 5,789,934 A | 8/1998 | Kolkowski et al. | |
| 6,031,361 A | 2/2000 | Burstein et al. | |
| 6,087,843 A | 7/2000 | Pun et al. | |
| 6,100,676 A | 8/2000 | Burstein et al. | |
| 6,198,261 B1 | 3/2001 | Schultz et al. | |
| 6,268,716 B1 | 7/2001 | Burstein et al. | |
| 6,323,668 B1 | 11/2001 | Hashimoto | |
| 6,556,034 B1 | 4/2003 | Johnson et al. | |
| 7,005,867 B2 | 2/2006 | Hashimoto | |
| 7,132,844 B2 | 11/2006 | Hashimoto | |
| 8,164,351 B2 * | 4/2012 | Hashimoto | 324/678 |
| 2001/0017769 A1 | 8/2001 | Ito | |
| 2002/0135340 A1 | 9/2002 | Hashimoto | |
| 2008/0174318 A1 | 7/2008 | Seki | |

(Continued)

FOREIGN PATENT DOCUMENTS

| | | |
|---|---|---|
| JP | 7-209372 A | 8/1995 |
| JP | 7-248353 A | 9/1995 |

(Continued)

OTHER PUBLICATIONS

Office Action, issued on Oct. 7, 2011 in related case, U.S. Appl. No. 12/603,350.

(Continued)

*Primary Examiner* — Minh N Tang

(57) ABSTRACT

Provided is a test apparatus that measures a peak in a current supplied to a device under test via a transmission path which transmits power from a power supply to a device under test, the peak including a frequency component higher than a frequency corresponding to a product of an inductance component from the power supply to the device under test and a capacitance component between the transmission path and a ground potential, and judges acceptability of the device under test based on the peak measured by the current measuring section.

20 Claims, 16 Drawing Sheets

(56) References Cited

U.S. PATENT DOCUMENTS

2009/0121725 A1    5/2009    Hashimoto
2009/0121726 A1    5/2009    Hashimoto
2011/0031984 A1*   2/2011    Hashimoto et al. ........... 324/678

FOREIGN PATENT DOCUMENTS

| JP | 11-23655 A | 1/1999 |
|---|---|---|
| JP | 2001-195139 A | 7/2001 |
| JP | 2001-251034 A | 9/2001 |
| JP | 2002-530036 A | 9/2002 |
| JP | 2003-14825 A | 1/2003 |
| JP | 2006-344740 A | 12/2006 |
| JP | 2009-74900 A | 4/2009 |
| JP | 2009-115794 A | 5/2009 |
| JP | 2009-121843 A | 6/2009 |
| WO | 00-26740 A1 | 5/2000 |
| WO | 2006/054435 A1 | 5/2006 |

OTHER PUBLICATIONS

Korean Office Action dated Apr. 30, 2012 in a counterpart Korean patent application No. 10-2010-7020772.
Korean Office Action dated Apr. 30, 2012 in a counterpart Korean patent application No. 10-2010-7020773.
Korean Office Action dated Apr. 29, 2012 in a counterpart Korean patent application No. 10-2010-7020774.
International Search Report (ISR) issued in PCT/JP2010/001333 (parent application) mailed in Apr. 2010 for Examiner consideration, and U.S. Patent Application Publication Nos. US2009/121725 and US2002/135340, and Foreign Patent document JP2009-115794, JP2001-195139, and JP2009-74900.
English translation of International Search Report (ISR) issued in PCT/JP2009/003482 (parent application) mailed in Oct. 2009 for Examiner consideration, citing U.S. Patent Application Publication Nos. US2009/121725, US2008/174318, US2001/17769, and Foreign Patent document Nos. JP2009-115794, WO2006/054435, JP7-248353, JP2009-74900, JP2006-344740, JP11-23655, JP2001-251034, and JP7-209372.
Written Opinion (PCT/ISA/237) issued in PCT/JP2010/001333 mailed in Apr. 2010.
Written Opinion (PCT/ISA/237) issued in PCT/JP2009/003482 mailed in Oct. 2009.
Applicant bring the attention of the Examiner to the following pending U.S. Appl. No. 12/502,946, filed Jul. 14, 2009, U.S. Appl. No. 12/603,350, filed Oct. 21, 2009, U.S. Appl. No. 12/876,052, filed Sep. 3, 2010 and U.S. Appl. No. 12/877,097, filed Sep. 7, 2010.
International Search Report (ISR) for PCT/JP2009/003482 (parent application) for Examiner consideration, Apr. 2007.

* cited by examiner

TEST APPARATUS, ADDITIONAL CIRCUIT AND TEST BOARD FOR JUDGMENT BASED ON PEAK CURRENT

This application is a continuation of U.S. Patent Application No. PCT/JP2010/001330, filed on Feb. 26, 2010, and is a continuation-in-part of U.S. Pat. No. 12/603,350, filed on Oct. 21, 2009, now U.S. Pat. No. 8,164,351, which is a continuation of U.S. Patent Application No. PCT/JP2009/003482, each of the foregoing applications herby incorporated by reference in their entirety.

BACKGROUND

1. Technical Field

The present invention relates to a test apparatus, an additional circuit, and a test board.

2. Related Art

When testing a device under test such as a semiconductor circuit, a power supply apparatus that supplies current to the device under test sometimes cannot quickly follow fluctuation in the current consumed by the device under test. A known technique for solving this problem, as shown in Patent Document 1, involves providing a bypass capacitor to the power supply line near the device under test.

Patent Document 1: Japanese Patent Application Publication No. 2001-195139
Patent Document 2: U.S. Pat. No. 6,087,843

A bypass capacitor is provided that has a large capacitance, e.g. tens of µF, capable of following a large fluctuation in the power supply current. In order to measure a low current, such as standby current, it is necessary to measure a low output current of the power supply apparatus. In this case, there is a limit on the load capacitance connected to the power supply apparatus, and so a lead relay is provided to disconnect a high-capacitance bypass capacitor from the power supply line.

However, since there are structural limitations near the device under test, a lead relay cannot be provided there. As a result, the high-capacitance bypass capacitor cannot be provided near the device under test, and is instead provided at a distance from the device under test.

Therefore, the power supply line from the bypass capacitor to the device under test is lengthened, which increases the inductance component between the bypass capacitor and the device under test. As a result, it becomes difficult to supply high-frequency current from the bypass capacitor to the device under test.

When the load current of the device under test fluctuates, the power supply voltage applied to the device under test temporarily drops due to the responsiveness of the power supply, the value of the bypass capacitor, and a voltage drop by the resistance component of the transmission path. Conventionally, the current supplied from the power supply or the high-capacitance bypass capacitor is measured, and so high-frequency components of the load current cannot be detected. Therefore, when the load current of the device under test fluctuates momentarily, the fluctuation of the load current cannot be detected, and so the acceptability of the device under test cannot be accurately judged.

SUMMARY

Therefore, it is an object of an aspect of the innovations herein to provide a test apparatus, an additional circuit, and a test board, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, one exemplary test apparatus may include a test apparatus that tests a device under test, comprising a power supply that generates power supplied to the device under test; a transmission path that transmits the power generated by the power supply to the device under test; a current measuring section that measures a peak in current supplied to the device under test via the transmission path, the peak including a frequency component higher than a frequency corresponding to a product of an inductance component from the power supply to the device under test and a capacitance component between the transmission path and a ground potential; and a judging section that judges acceptability of the device under test based on the peak measured by the current measuring section.

According to a second aspect related to the innovations herein, one exemplary additional circuit may include an additional circuit that is used in a test apparatus for testing a device under test, wherein the test apparatus includes a power supply that generates power supplied to the device under test; a transmission path that transmits the power generated by the power supply to the device under test; and a judging section that judges acceptability of the device under test based on a peak in current supplied to the device under test, the additional circuit comprising a peak measuring section that (i) measures the peak in the current supplied to the device under test via the transmission path, the peak including a frequency component higher than a frequency corresponding to a product of an inductance component from the power supply to the device under test and a capacitance component between the transmission path and a ground potential, and (ii) notifies the judging section concerning the measured peak.

According to a third aspect related to the innovations herein, one exemplary test board may include a test board that is used in a test apparatus for testing a device under test, comprising a transmission path that transmits power generated by a power supply, which is provided in a test apparatus, to the device under test; and a peak measuring section that (i) measures a peak in current supplied to the device under test via the transmission path, the peak including a frequency component higher than a frequency corresponding to a product of an inductance component between the power supply and the device under test and a capacitance component between the transmission path and a ground potential, and (ii) notifies a judging section provided in the test apparatus concerning the measured peak.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
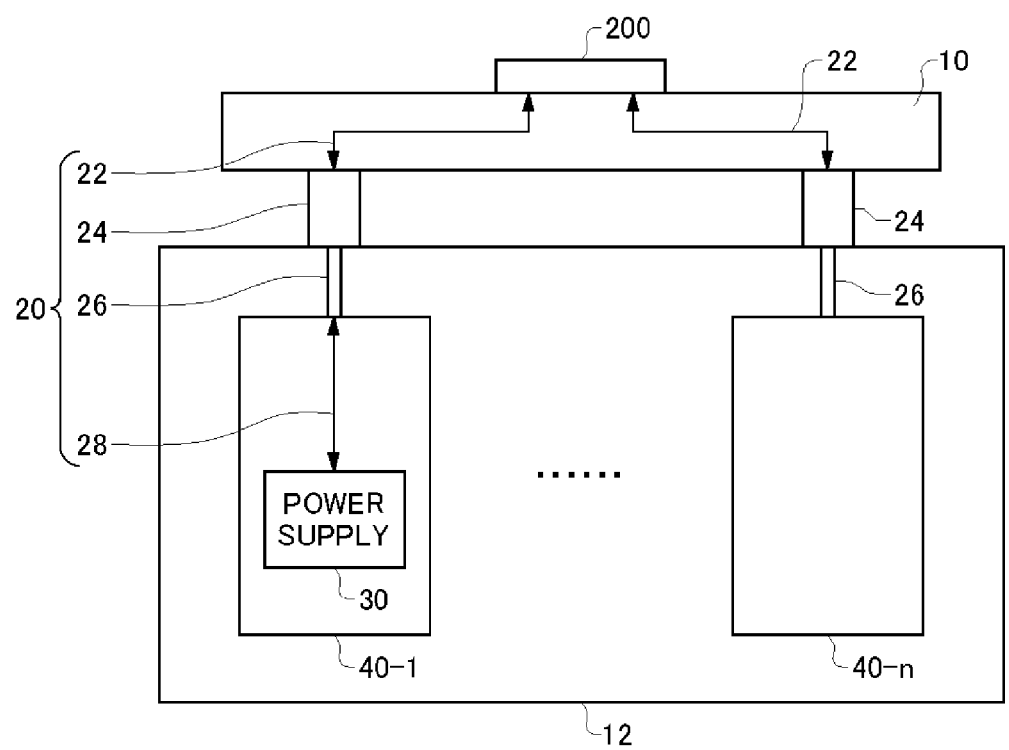
FIG. 1 shows a configuration of a test apparatus 100 according to an embodiment of the present invention, along with a device under test 200.

FIG. 1 shows a configuration of a test apparatus 100 according to an embodiment of the present invention, along with a device under test 200. The test apparatus 100 tests the device under test 200, which may be a semiconductor circuit, and includes a test board 10 and a test head 12.

The test board 10 electrically connects the device under test 200 to the test head 12. For example, the test board 10 may include a socket on which the device under test 200 is mounted to be electrically connected thereto and wiring that electrically connects the socket to the test head 12. Instead, the test board 10 may include a probe pin that contacts a terminal of the device under test 200 and wiring that electrically connects the probe pin to the test head 12.

The test head 12 generates a test signal and supply power or the like, and supplies the generated signals etc. to the device under test 200 via the test board 10. The test head 12 judges acceptability of the device under test 200 by measuring a prescribed characteristic of the device under test 200 when the test signal or the like is supplied thereto. For example, the test head 12 may measure a data pattern of a signal output by the device under test 200 or power consumed by the device under test 200.

The test head 12 of the present embodiment includes a plurality of test modules 40. Each test module 40 is electrically connected to the test board 10 via the connector 24. Each test module 40 may have a different function. For example, the test head 12 may include a test module 40 used to supply power, a test module 40 used for analog signals, and a test module 40 used for digital signals.

In the present embodiment, the test module 40-1 includes a power supply 30 for supplying power to the device under test 200. The power supply 30 is electrically connected to the device under test 200 via the transmission path 20.

The transmission path 20 transmits the power generated by the power supply 30 to the device under test 200. The transmission path 20 may include module wiring 28, a cable 26, a connector 24, and board wiring 22. The module wiring 28 is formed within the test module 40. The cable 26 connects the test module 40 to the connector 24. The board wiring 22 is formed on the test board 10.

The test apparatus 100 of the present invention measures the current consumed by the device under test 200 by measuring the current flowing through the transmission path 20. The test module 40-1 may judge the acceptability of the device under test 200 based on the result of the measurement of the current flowing through the transmission path 20.

Figure 2:
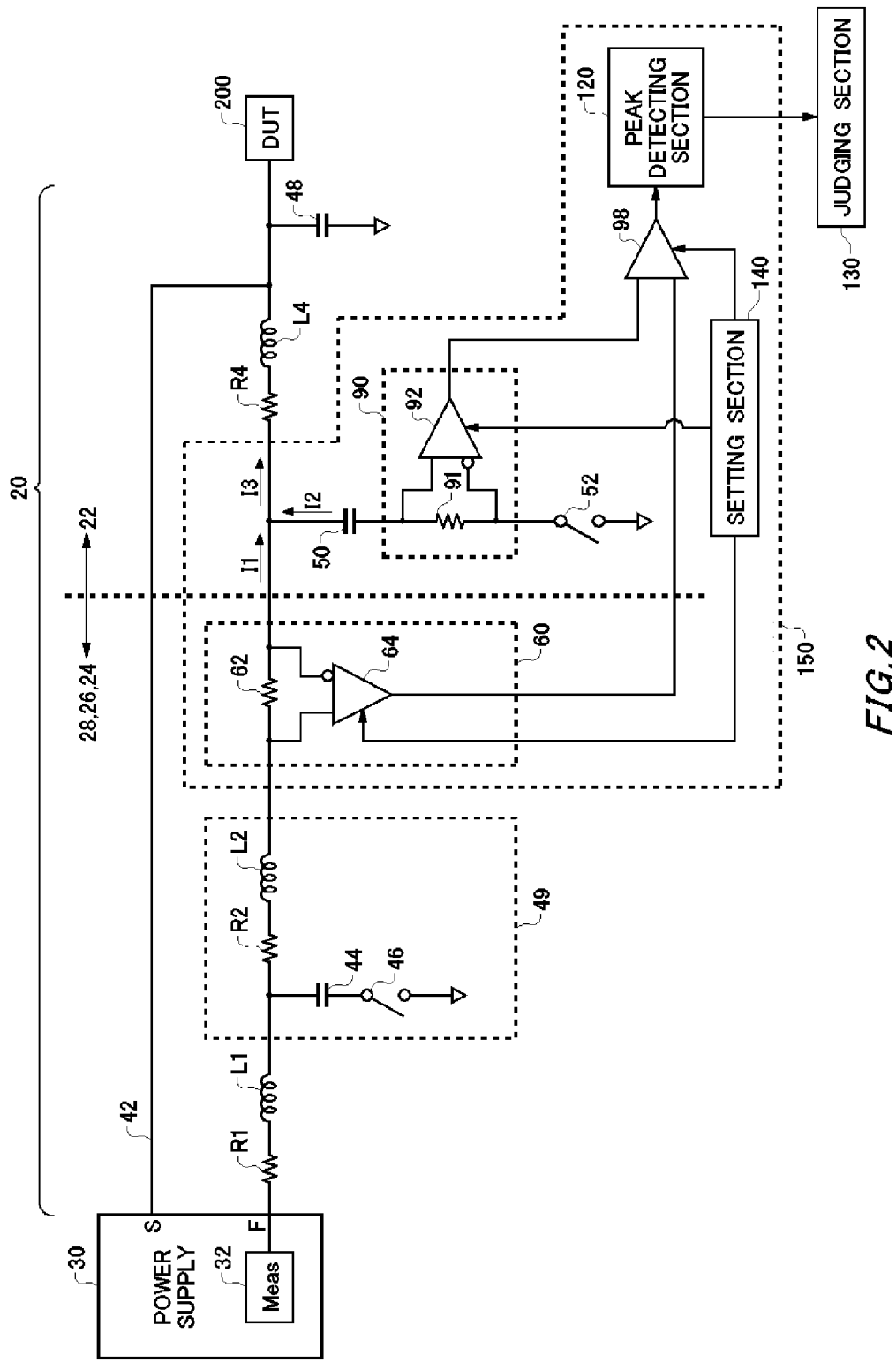
FIG. 2 shows an exemplary configuration of a circuit for measuring the current flowing through the transmission path 20.

FIG. 2 shows an exemplary configuration of a circuit for measuring the current flowing through the transmission path 20. As described above, the power supply 30 is connected to the device under test 200 via the transmission path 20. The power supply 30 may include a low current measuring section 32 that measures a low current, such as the standby current of the device under test 200. The low current measuring section 32 may measure the current output by the power supply 30.

The test apparatus 100 includes a mid-speed current supply section 49, a current measuring section 150, a low-capacitance capacitor 48, and a judging section 130. The current measuring section 150 includes an intermediate capacitor 50, a charge/discharge current measuring section 90, a switch 52, a power supply current measuring section 60, a load current calculating section 98, a peak detecting section 120 and a setting section 140. In FIG. 2, R1, R2, R4, L1, L2, and L4 represent resistance components and inductance components of the transmission path 20.

The mid-speed current supply section 49 includes a high-capacitance capacitor 44, a switch 46, the resistance component R2, and the inductance component L2. The high-capacitance capacitor 44 is connected between the transmission path 20 and a ground potential, at a position closer to the power supply 30 than the intermediate capacitor 50. The high-capacitance capacitor 44 of the present embodiment is provided between the ground potential and a position on the transmission path 20 closer to the power supply 30 than the connector 24, e.g. a position of the module wiring 28. The capacitance of the high-capacitance capacitor 44 may be greater than a maximum load capacitance allowed for the low current measuring section 32. This maximum load capacitance may be a specification value of the low current measuring section 32.

The switch 46 switches whether the high-capacitance capacitor 44 is connected between the module wiring 28 and the ground potential. The switch 46 may be a lead relay.

The low-capacitance capacitor 48 is positioned between the ground potential and the transmission path 20 at a position closer to the device under test 200 than the intermediate capacitor 50. The low-capacitance capacitor 48 of the present embodiment is provided on the test board 10 between the board wiring 22 and the ground potential. The capacitance of the low-capacitance capacitor 48 is less than the capacitance of the high-capacitance capacitor 44. The capacitance of the low-capacitance capacitor 48 may be less than the maximum load capacitance allowed for the low current measuring section 32.

The current measuring section 150 measures a peak in the current supplied to the device under test 200 via the transmission path 20, and this peak includes a frequency component that is higher than a frequency corresponding to the product of the inductance component L from the power supply 30 to the device under test 200 and the capacitance component C between the transmission path 20 and the ground potential. The inductance component L may include an inductance component connected to an output terminal in the power supply 30.

The inductance component L and the capacitance component C function as a low-pass filter inserted between the power supply 30 and the device under test 200, and so the frequency of the current flowing from the power supply 30 to the device under test 200 is limited to be no greater than a cutoff frequency corresponding to the product LC. However, in addition to the current supplied directly from the power supply 30 to the device under test 200, a high-frequency current is also supplied to the device under test 200 from a low-capacitance component.

Therefore, even though the current output by the power supply 30 is measured in the transmission path 20, only a component that is no greater than the cutoff frequency corresponding to LC in the current flowing through the device under test 200 can be measured. For this reason, the current measuring section 150 measures current peaks that include the frequency component that is higher than the cutoff frequency corresponding to LC. More specifically, the current measuring section 150 measures these current peaks by measuring the charge/discharge current of the intermediate capacitor 50.

The intermediate capacitor 50 is provided between the ground potential and the transmission path 20 at a position between the high-capacitance capacitor 44 and the low-capacitance capacitor 48. The intermediate capacitor 50 is preferably connected to the transmission path 20 such that the distance between the intermediate capacitor 50 and the low-capacitance capacitor 48 is less than the distance between the intermediate capacitor 50 and the high-capacitance capacitor 44.

More specifically, the intermediate capacitor 50 is preferably positioned in a manner such that the inductance component L4, which is the inductance of the transmission path 20 between the intermediate capacitor 50 and the low-capacitance capacitor 48, is sufficiently less than the inductance component L2, which is the inductance of the transmission path 20 between the intermediate capacitor 50 and the high-capacitance capacitor 44. The intermediate capacitor 50 of the present embodiment is connected to the board wiring 22 of the test board 10 between the low-capacitance capacitor 48 and the connector 24.

By providing the intermediate capacitor 50 closer to the device under test 200 than the cable 26 and the connector 24, the inductance component L4 can be made sufficiently lower than the inductance component L2. As a result, the charge/discharge current of the intermediate capacitor 50 can follow a fluctuation in the current consumed by the device under test 200 relatively quickly.

The capacitance of the intermediate capacitor 50 may be greater than the capacitance of the low-capacitance capacitor 48 and less than the capacitance of the high-capacitance capacitor 44. The capacitance of the low-capacitance capacitor 48 may be approximately 1 μF and the capacitance of the intermediate capacitor 50 may be approximately 10 μF. The capacitance of the intermediate capacitor 50 may be greater than the maximum load capacitance allowed for the low current measuring section 32.

The switch 52 switches whether the intermediate capacitor 50 is connected between the module wiring 28 and the ground potential. The switch 52 may be smaller than the switch 46. For example, the switch 52 may be a semiconductor switch. When using the low current measuring section 32 to measure a low current such as the standby current of the device under test 200, the switch 46 and the switch 52 may disconnect the high-capacitance capacitor 44 and the intermediate capacitor 50 from between the transmission path 20 and the ground potential.

The power supply current measuring section 60 measures the current I1 flowing through the transmission path 20 in a region on the power supply 30 side of the intermediate capacitor 50. For example, the power supply current measuring section 60 may measure the current I1 flowing through the transmission path 20 between the high-capacitance capacitor 44 and the connector 24. The power supply current measuring section 60 may be provided in the test module 40.

The power supply current measuring section 60 of the present embodiment includes a first detection resistor 62 and a differential circuit 64. The first detection resistor 62 is provided on the transmission path 20 at a position closer to the power supply 30 than the connector 24, and causes a voltage drop corresponding to the current value flowing through the transmission path 20. The first detection resistor 62 may be provided on the module wiring 28, for example.

The differential circuit 64 functions as a first potential difference detecting section that detects a potential difference between the ends of the first detection resistor 62. The current I1 flowing through the first detection resistor 62 can be measured by multiplying the potential difference by the resistance value of the first detection resistor 62.

The configuration of the power supply current measuring section 60 is not limited to the example shown in FIG. 2. The power supply current measuring section 60 may include a current probe instead of the first detection resistor 62 and the differential circuit 64. The current probe may detect the current flowing through the transmission path 20 by converting the magnetic field caused by the current flowing through the transmission path 20 into voltage.

The charge/discharge current measuring section 90 measures the charge/discharge current I2 of the intermediate capacitor 50. The charge/discharge current measuring section 90 of the present embodiment includes a second detection resistor 91 and a differential circuit 92. The second detection resistor 91 is provided between the intermediate capacitor 50 and the switch 52, and causes a voltage drop corresponding to the charge/discharge current I2 of the intermediate capacitor 50.

The differential circuit 92 functions as a second potential difference detecting section that detects a potential difference between the ends of the second detection resistor 91. The current I2 flowing through the second detection resistor 91 can be measured by multiplying the potential difference by the resistance value of the second detection resistor 91.

The load current calculating section 98 calculates a load current I3 flowing through the device under test 200 based on the current I2 measured by the charge/discharge current measuring section 90. As described above, the intermediate capacitor 50 tracks fluctuation of the load current I3 more quickly than the power supply 30. Therefore, the current I2 includes a higher-frequency current component than the current I1. The load current calculating section 98 may calculate the current component that is higher than that of the current I1 within the load current I3 by measuring the current I2.

Instead, the load current calculating section 98 may calculate the load current I3 flowing through the device under test 200 based on the sum of the current I1 measured by the power supply current measuring section 60 and the current I2 measured by the charge/discharge current measuring section 90. As a result, the load current calculating section 98 can calculate a load current I3 that includes both a low-frequency component and a high-frequency component. The present example describes a case in which the load current calculating section 98 calculates the sum of the current I2 and the current I3.

The peak detecting section 120 detects a peak if the load current I3 based on whether the sum of the current I1 measured by the power supply current measuring section 60 and the current I2 measured by the charge/discharge current measuring section 90 exceeds a predetermined threshold value. Since the charge/discharge current measuring section 90 can detect a high-frequency current, the peak detecting section 120 can detect high-frequency current peaks.

The judging section 130 judges the acceptability of the device under test 200 based on current peaks detected by the peak detecting section 120. For example, the judging section 130 may judge the acceptability of the device under test 200 based on the number of current peaks detected by the peak detecting section 120 within a predetermined time period. As a result, the judging section 130 can judge the acceptability of the device under test 200 based on high-frequency current peaks.

The setting section 140 sets the gain of the differential circuit 92. The differential circuit 92 is an amplifier that amplifies the potential difference between the ends of the second detection resistor 91 by the set gain. For example, the setting section 140 may sequentially change the set gain of the differential circuit 92 to be a plurality of values, and the high-frequency current to be measured may be detected at each gain setting. At this time, the transmission path 20 is supplied with the same current each time the gain setting value is changed. When setting the gain of the differential circuit 92, a setting load may be connected to the transmission path 20 in place of the device under test 200.

The setting section 140 sets the gain of the differential circuit 92 such that the level of the current peak detected for each gain setting is maximized. Since a normal amplification circuit changes the frequency characteristics according to the gain setting, the gain of the frequency to be measured might decrease even if the gain setting value is large. By measuring the current peaks of the load current of the device under test 200 after performing the above setting, the gain can be set according to the frequencies of the current peaks to be measured.

As shown in FIG. 2, when the low-capacitance capacitor 48 is connected to the transmission path 20 between the device under test 200 and the intermediate capacitor 50, the load current calculating section 98 calculates the current flowing through the device under test 200 and the low-capacitance capacitor 48 based on the current I1 and the current I2. Since the time during which the charge/discharge current of the low-capacitance capacitor 48 flows is relatively short, the load current calculating section 98 may set the current flowing through the device under test 200 to be the sum of the current I1 and the current I2. Furthermore, the low-capacitance capacitor 48 may be a capacitor within the device under test 200.

As described above, by providing the intermediate capacitor 50 near the device under test 200 and calculating the sum of the charge/discharge current I2 of the intermediate capacitor 50 and the power supply current I1, the current consumed by the device under test 200 can be accurately measured. In other words, even when the power supply current I1 cannot quickly follow the fluctuation of the current consumed by the device under test 200, the charge/discharge current I2 that changes quickly is measured, thereby enabling accurate measurement of the current consumed by the device under test 200.

The power supply current measuring section 60 can be provided closer to the power supply 30 than the intermediate capacitor 50, and therefore the circuit design is simpler than a circuit design in which the power supply current measuring section 60 is provided on the test board 10. Instead of the power supply current measuring section 60, a measurement circuit housed in the power supply 30, such as the low current measuring section 32, can be used to measure the power supply current I1.

By using a semiconductor switch for the switch 52, the switch 52 can be easily provided to the test board 10, which has structural limitations such as the height of elements therein. Therefore, even when the test board 10 is provided with an intermediate capacitor 50 with a relatively high capacitance, the switch 52 can be provided to control whether the intermediate capacitor 50 is connected to the transmission path 20.

The power supply 30 may detect, via the detection line 42, the load current applied to the device under test 200. The power supply 30 controls the output voltage such that the detected load voltage remains at a prescribed amount. The detection line 42 may detect the voltage in the transmission path 20 on the device under test 200 side of the power supply current measuring section 60.

Figure 3:
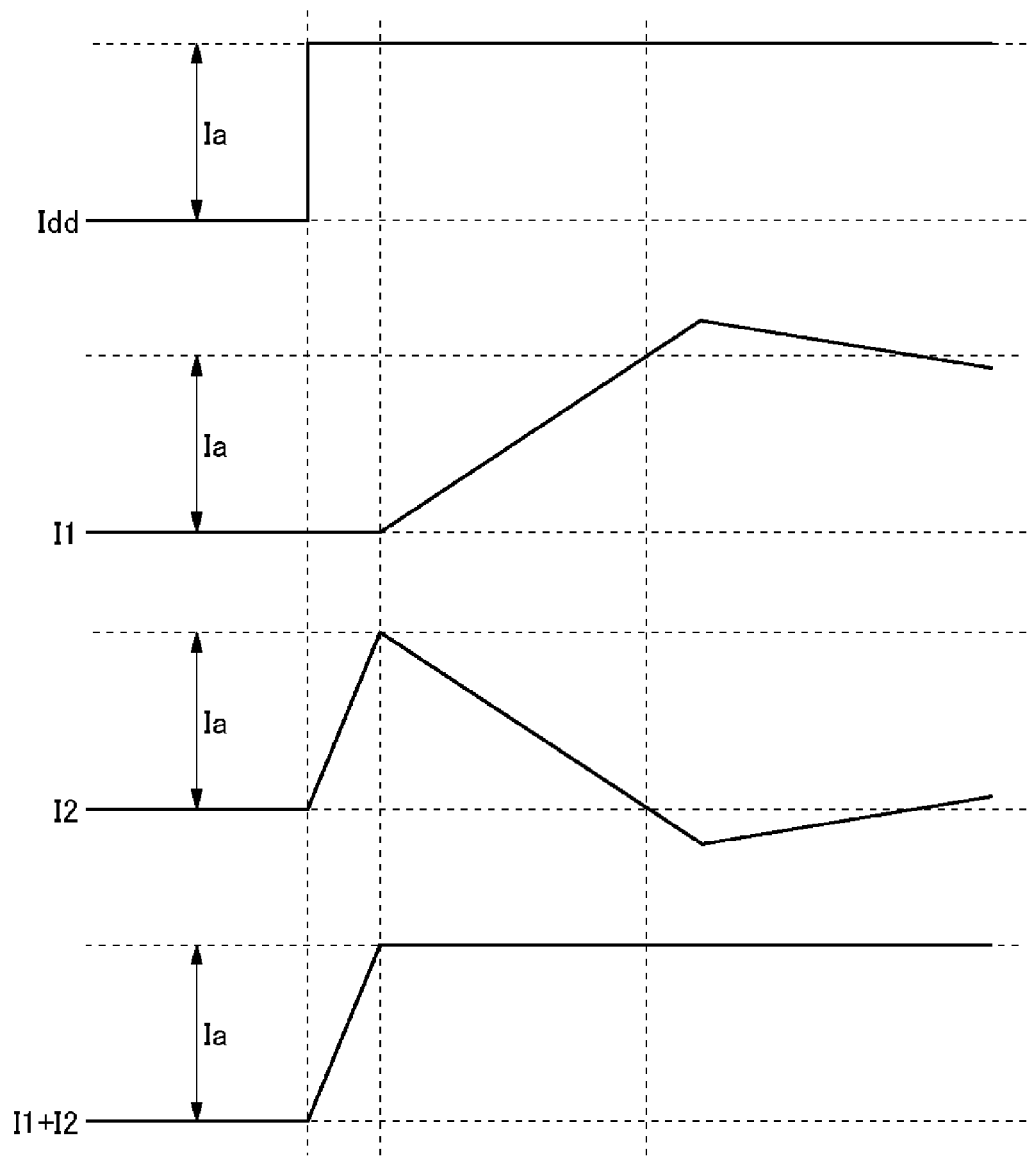
FIG. 3 shows an exemplary current I1 measured by the power supply current measuring section 60 and an exemplary current I2 measured by the charge/discharge current measuring section 90.

FIG. 3 shows an exemplary current I1 measured by the power supply current measuring section 60 and an exemplary current I2 measured by the charge/discharge current measuring section 90. In FIG. 3, the horizontal axis represents time and the vertical axis represents level. Furthermore, Idd in FIG. 3 represents the current consumed by the device under test 200.

As shown in FIG. 3, when the consumed current Idd of the device under test 200 changes suddenly, the power supply current I1 from the power supply 30 and the high-capacitance capacitor 44 cannot quickly follow this change. On the other hand, the charge/discharge current I2 from the intermediate capacitor 50 follows the consumed current Idd relatively quickly. Therefore, as shown in FIG. 3, the consumed current Idd of the device under test 200 can be accurately measured by calculating the sum of the power supply current I1 and the charge/discharge current I2.

In the circuit described in relation to FIG. 2, the first detection resistor 62 and the second detection resistor 91 are additionally provided to detect the current. Therefore, the fluctuation of the power supply voltage applied to the device under test 200 when the consumed current of the device under test 200 fluctuates increases according to the resistance values of the first detection resistor 62 and the second detection resistor 91.

The resistance value of the first detection resistor 62 is set as R1, the resistance value of the second detection resistor 91 is set as R2, and the maximum fluctuation amount of the consumed current Idd is set as I1. In this case, the maximum fluctuation $\Delta V_{max}$ in the power supply voltage applied to the device under test 200 due to the inclusion of the first detection resistor 62 and the second detection resistor 91 is Ia×(R1+R2).

The first detection resistor 62 and the second detection resistor 91 preferably have resistance values according to the allowable fluctuation amount for the power supply voltage applied to the device under test 200. For example, when the maximum fluctuation amount of the consumed current is 100 mA and the allowable value for the power supply fluctuation is 20 mV, the sum of the resistance values of the first detection resistor 62 and the second detection resistor 91 is set to be no greater than 200 mΩ (20 mV/100 mA) according to the above expression.

The current path of the power supply current I1 is an LCR series resonant circuit. Therefore, if the damping resistance of the series resonant circuit is not sufficiently smaller than the resistance component of the current path, charge/discharge current with large vibration occurs. This causes the measurement result of the power supply current I1 to include a charge/discharge current flowing to the intermediate capacitor 50 due to series resonance. To prevent this, the circuit shown in FIG. 2 measures the sum of the power supply current I1 and the charge/discharge current I2. Since the power supply current I1 and the charge/discharge current I2 each include the effect of the charge/discharge current due to series resonance, the effects of the charge/discharge current due to series resonance cancel each other out.

Figure 4:
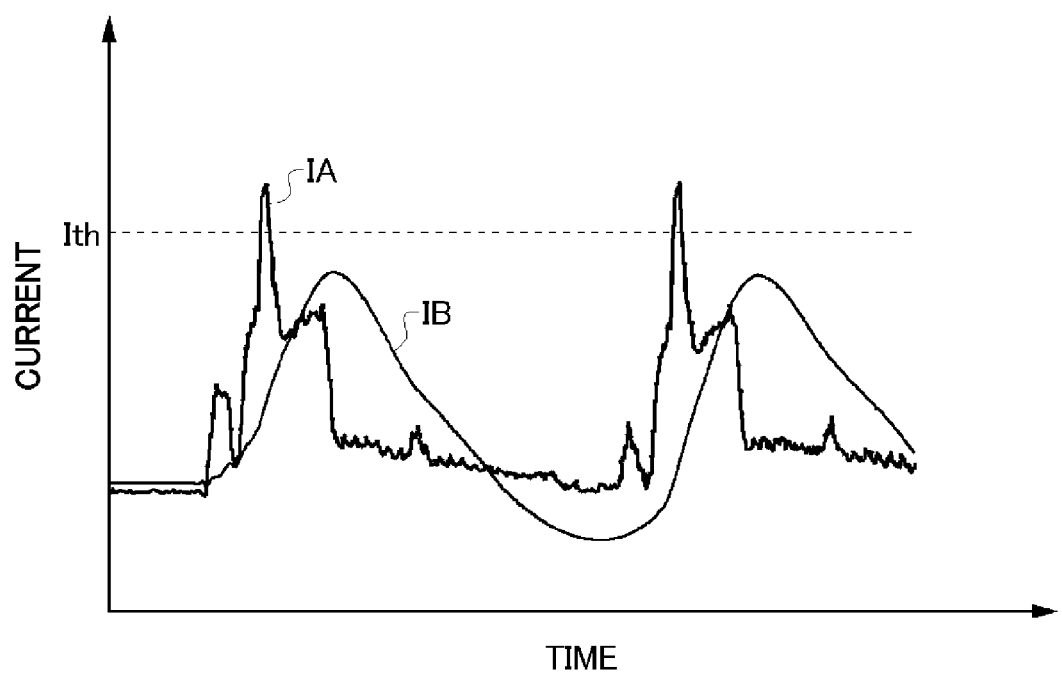
FIG. 4 shows a load current IA calculated by the load current calculating section 98 and a current IB output by the power supply 30.

FIG. 4 shows a load current IA calculated by the load current calculating section 98 and a current IB output by the power supply 30. As described above, the load current calculating section 98 can measure the load current IA whose frequency is higher than that of the current IB output by the power supply 30.

The peak detecting section 120 detects the current peaks based on whether the load current IA calculated by the load current calculating section 98 exceeds a predetermined threshold value Ith. As a result, the load current calculating section 98 can detect the high-frequency peaks. The threshold value Ith may be set in advance by a user or the like, or may be determined based on the current measured by the power supply current measuring section 60. The peak detecting section 120 may use a threshold value Ith that is greater than the peak value or an average value of the current measured by the power supply current measuring section 60.

Figure 5:
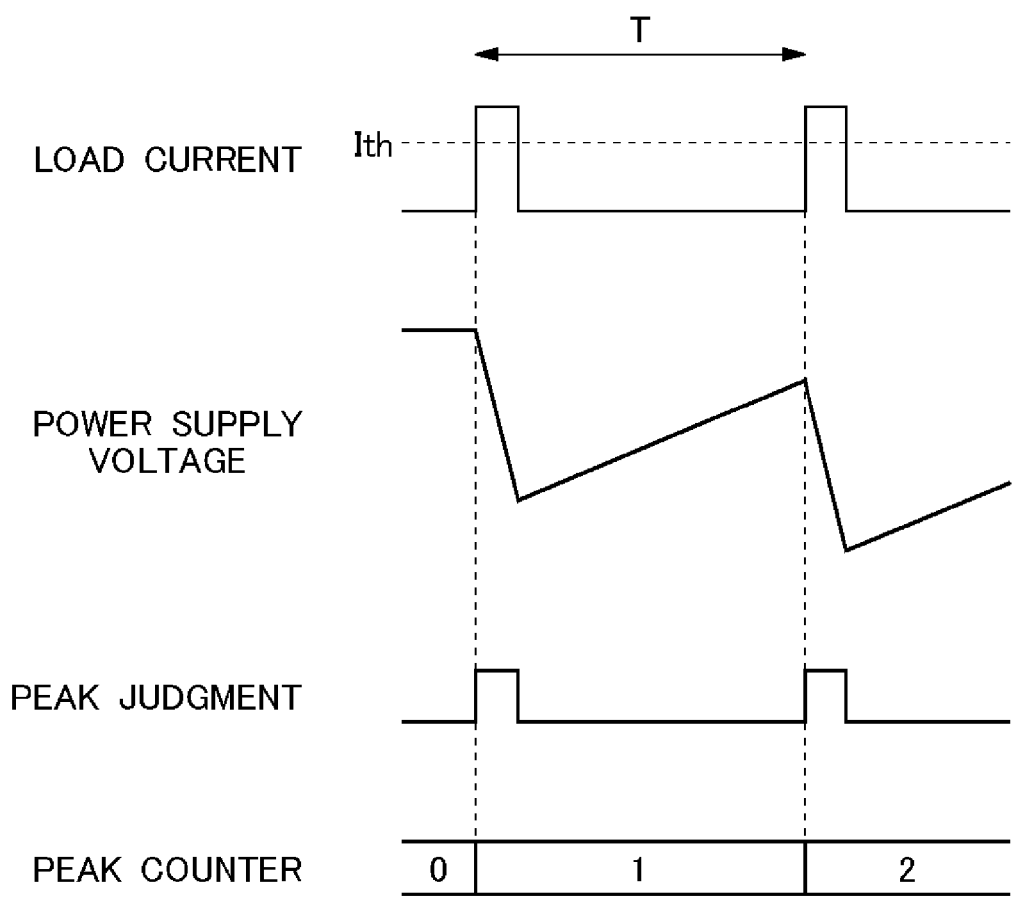
FIG. 5 shows an exemplary power supply voltage applied to the device under test 200.

FIG. 5 shows an exemplary power supply voltage applied to the device under test 200. When the load current increases, the power supply voltage applied to the device under test 200 temporarily drops due to responsiveness of the power supply 30, the values of the capacitors connected to the transmission path 20, the resistance components of the transmission path 20, or the like. Therefore, when a large current peak occurs in the load current, the power supply voltage falls greatly.

The output voltage of the power supply 30 changes to keep a prescribed power supply voltage applied to the device under test 200, and so the power supply voltage gradually recovers after the drop. However, when a large current peak occurs in the load current before the power supply voltage returns to the prescribed voltage, the power supply voltage drops even further. Therefore, when a current peak greater than or equal to a prescribed level occurs more frequently than a certain amount, the power supply voltage applied to the device under test 200 falls outside of the allowable range.

The judging section 130 may judge the acceptability of the device under test 200 based on the number of current peaks detected by the peak detecting section 120 within a predetermined measurement period. The peak detecting section 120 may judge whether a current peak occurs in the load current and calculate the number of times that a current peak is judged to have occurred with a predetermined measurement period.

As shown in FIG. 4, the test apparatus 100 of the present embodiment can measure a current whose frequency is higher than that of the current IB output by the power supply 30. Therefore, the test apparatus 100 can detect a high-frequency current peak that cannot be observed in the current IB. The test apparatus 100 then judges the acceptability of the device under test 200 based on how frequently these current peaks occur, and can therefore detect defects in the device under test 200 that are undetectable by merely measuring the current IB.

The judging section 130 may judge the acceptability of the device under test 200 based on a time interval T between current peaks detected by the peak detecting section 120. For example, the judging section 130 may judge the acceptability of the device under test 200 based on whether a time interval T is less than the time necessary for the power supply voltage level to recover when a current peak at a prescribed level occurs.

Figure 6:
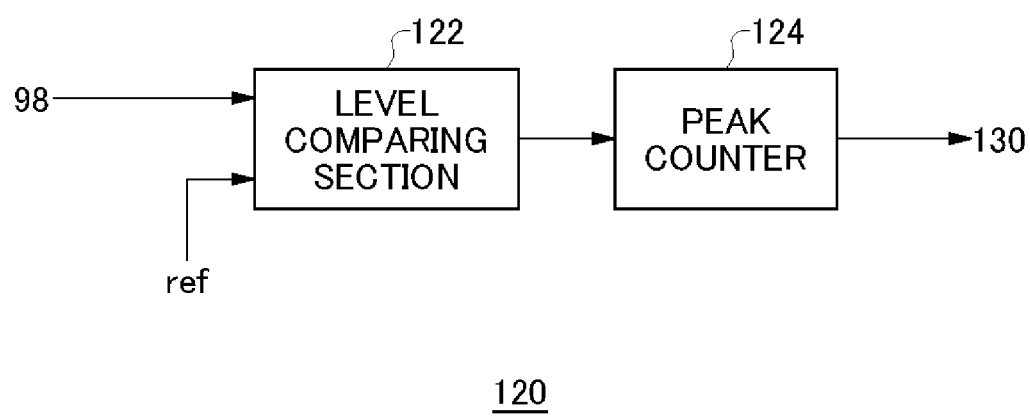
FIG. 6 shows an exemplary configuration of the peak detecting section 120.

FIG. 6 shows an exemplary configuration of the peak detecting section 120. The peak detecting section 120 includes a level comparing section 122 and a peak counter 124. The level comparing section 122 outputs a pulse when the level of the load current calculated by the load current calculating section 98 transitions from a level that is less than or equal to a predetermined threshold value REF to a level greater than the threshold value REF. The peak detecting section 120 may receive a voltage from the load current calculating section 98 corresponding to the level of the load current. In this case, the threshold value REF is a voltage corresponding to the threshold value Ith described in relation to FIG. 4.

The peak counter 124 counts the number of pulses output by the level comparing section 122 within a predetermined measurement period. This measurement period may have a start timing and an end timing set by a user or the like. The start timing of this measurement period may be the timing at which the peak counter 124 counts the first pulse. The peak counter 124 counts the number of pulses from the start timing until a predetermined period has passed.

The peak counter 124 notifies the judging section 130 concerning the count value when the measurement period ends. The judging section 130 judges the acceptability of the device under test 200 based on whether this count value is within a predetermined allowable range. With this configuration, the power supply voltage applied to the device under test 200 can be prevented from falling outside the allowable range.

Figure 7:
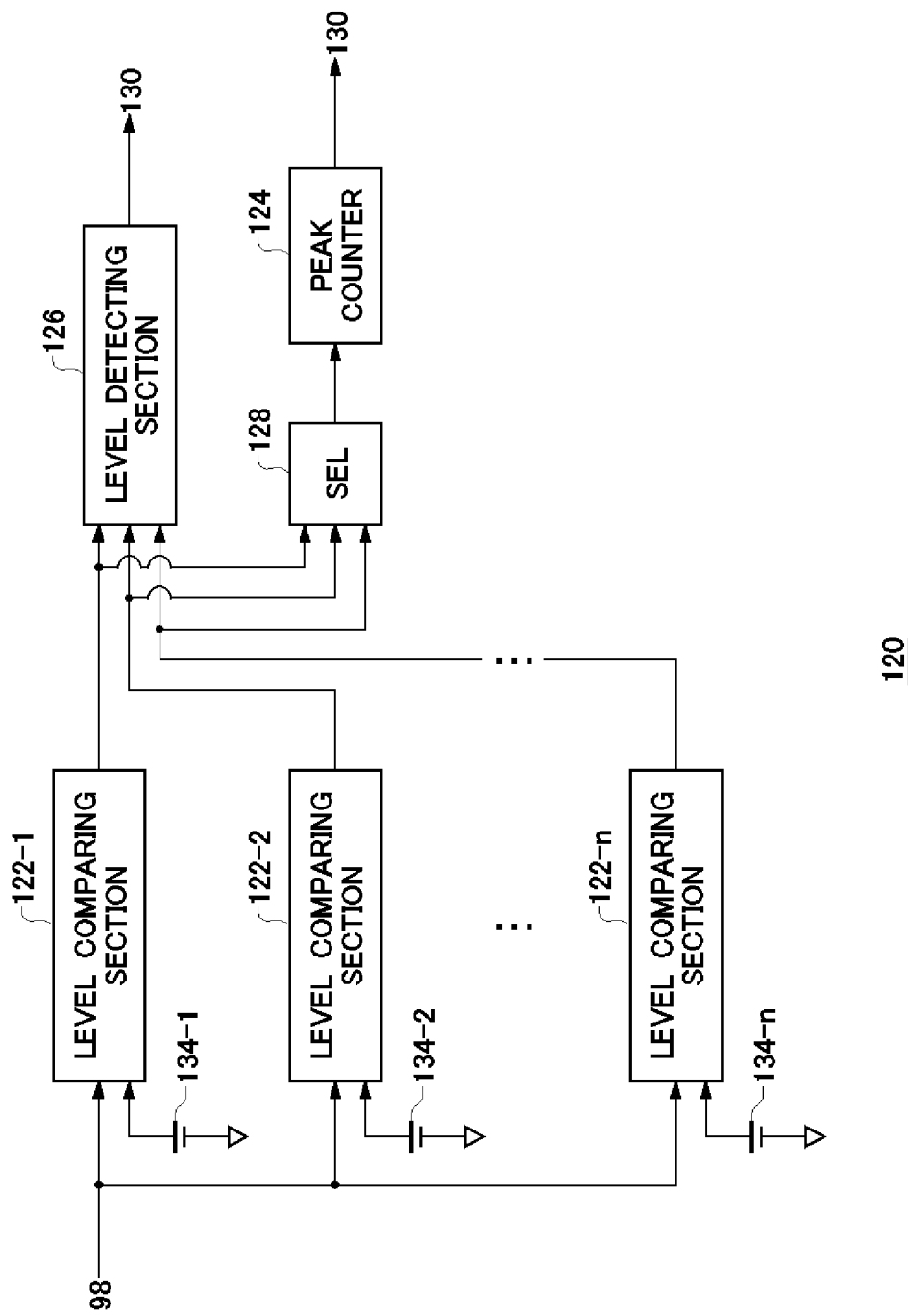
FIG. 7 shows another exemplary configuration of the peak detecting section 120.

FIG. 7 shows another exemplary configuration of the peak detecting section 120. The peak detecting section 120 of the present embodiment includes a plurality of level comparing sections 122-1 to 122-n, a plurality of threshold value generating sections 134-1 to 134-n, a level detecting section 126, a selecting section 128, and the peak counter 124. Any one of the level comparing sections 122-1 to 122-n can be referred to simply as a level comparing section 122. Any one of the threshold value generating sections 134-1 to 134-n can be referred to simply as a threshold value generating section 134.

The level comparing sections 122 and the peak counter 124 respectively have the same function as the level comparing section 122 and the peak counter 124 described in relation to FIG. 6. Each level comparing section 122 receives a different threshold value from a corresponding threshold value generating section 134. In other words, the threshold value generating sections 134 generate different threshold values and the level comparing sections 122 compare the level of the load current calculated by the load current calculating section 98 to these threshold values.

The level detecting section 126 detects the level of the load current calculated by the load current calculating section 98, based on the comparison results from the level comparing sections 122. For example, the level detecting section 126 detects the level of the load current based on a maximum threshold value from among the threshold values from the level comparing sections 122 judged to be less than the load current level. With this process, the peak detecting section 120 can detect the level of a current peak within a range of threshold values set for the level comparing sections 122. The level detecting section 126 notifies the judging section 130 concerning the detected level of the current peak.

The selecting section 128 selects a comparison result output by one of the level comparing sections 122, and inputs this comparison result to the peak counter 124. The selecting section 128 may select the level comparing section 122 that is set to have the lowest threshold value, the highest threshold value, or a central threshold value. A user or the like may set which level comparing section 122 is selected by the selecting section 128.

The peak counter 124 counts the number of pulses output by the level comparing section 122 selected by the selecting section 128 over the predetermined measurement period. With this process, the peak detecting section 120 can select a threshold value for detecting the current peaks.

The judging section 130 may judge the acceptability of the device under test 200 based on the level of the current peaks detected by the level detecting section 126 and the count value of the peak counter 124. For example, the judging section 130 may change the allowable values to which the count value of the peak counter 124 is compared, according to the maximum value for the level of the current peak detected by the level detecting section 126. More specifically, the judging section 130 may set the allowable value to which the count value is compared to be smaller when the maximum value for the level of the current peak is larger.

Figure 8:
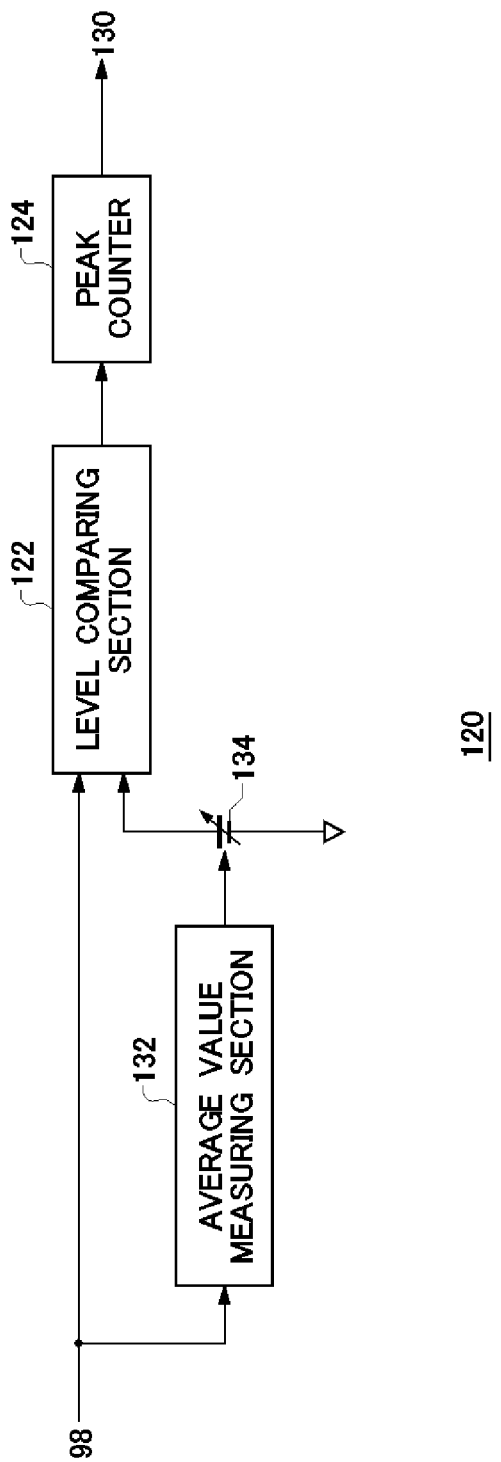
FIG. 8 shows another exemplary configuration of the peak detecting section 120.

FIG. 8 shows another exemplary configuration of the peak detecting section 120. The peak detecting section 120 of the present embodiment further includes an average value measuring section 132 and a threshold value generating section 134 in addition to the configuration of the peak detecting section 120 described in relation to FIG. 6. The threshold value generating section 134 generates a threshold value that is input to the level comparing section 122. The threshold value generating section 134 of the present embodiment includes a variable voltage source, and generates a variable threshold value.

The average value measuring section 132 determines the threshold value to be generated by the threshold value generating section 134 according to an average value, over a predetermined period, of the sum of the current measured by the power supply current measuring section 60 and the current measured by the charge/discharge current measuring section 90. For example, the average value measuring section 132 may set a larger threshold value when the current sum is larger. The average value measuring section 132 may instead determined the threshold value to be generated by the threshold value generating section 134 according to the average value of only the current measured by the power supply current measuring section 60.

The average value measuring section 132 may set the threshold value to be a value obtained as the sum of the average value of the calculated current and a predetermined constant value. Instead, the average value measuring section 132 may set the threshold value to be a value obtained as the product of the average value of the calculated current and a predetermined coefficient.

The average value measuring section 132 may instead set the threshold value to be a value obtained as the sum of a maximum value of the current measured by the power supply current measuring section 60 and a predetermined constant value. As another example, the average value measuring section 132 may set the threshold value to be a value obtained as the product of a maximum value of the current measured by the power supply current measuring section 60 and a predetermined coefficient. With this configuration, a suitable threshold value can be set even when the level of the load current is unknown.

Figure 9:
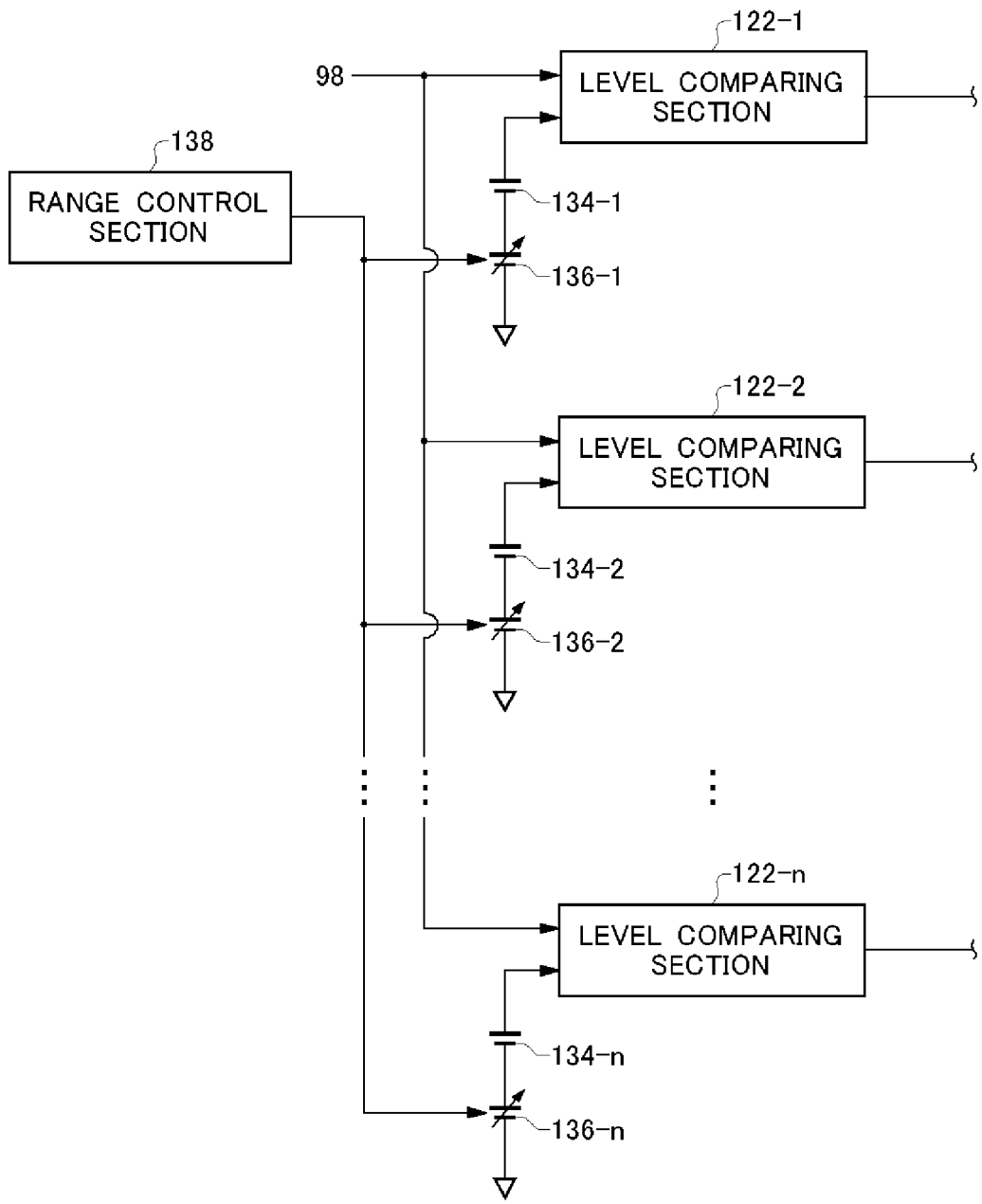
FIG. 9 shows another exemplary configuration of the peak detecting section 120.

FIG. 9 shows another exemplary configuration of the peak detecting section 120. The peak detecting section 120 of the present embodiment further includes a range control section 138 and a plurality of offset adding sections 136-1 to 136-n in addition to the configuration of the peak detecting section 120 described in relation to FIG. 7. Any one of the offset adding sections 136-1 to 136-n may be referred to simply as an offset adding section 136.

Each offset adding section 136 adds the same offset value to the threshold value generated by the corresponding threshold value generating section 134. Each offset adding section 136 may include a variable voltage source connected in series with the corresponding threshold value generating section 134.

Each level comparing section 122 compares the level of the current peak to a value resulting from the corresponding offset adding section 136 adding the offset value to the threshold value. The range control section 138 shifts the measurement range over which the level of the current peak is measured, by controlling the offset values of the offset adding sections 136. By setting the offset values of the measurement range according to the level of the current peak, the level of the current peak can be detected with high resolution. In the same manner as the average value measuring section 132, the range control section 138 may determine the offset values based on the current measured by the power supply current measuring section 60 and the current measured by the charge/discharge current measuring section 90.

Figure 10:
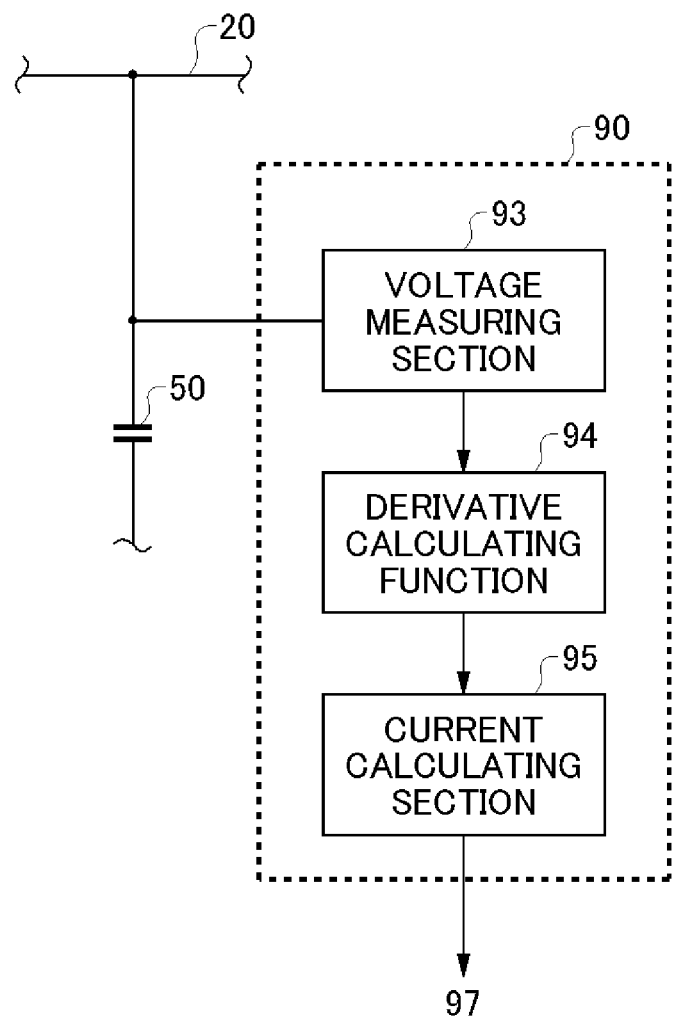
FIG. 10 shows another exemplary configuration of the charge/discharge current measuring section 90.

FIG. 10 shows another exemplary configuration of the charge/discharge current measuring section 90. The charge/discharge current measuring section 90 of the present embodiment includes a voltage measuring section 93, a derivative calculating section 94, and a current calculating section 95. The voltage measuring section 93 measures the voltage of the intermediate capacitor 50. For example, the voltage measuring section 93 may measure a change over time of the voltage at a transmission path 20 side terminal of the intermediate capacitor 50.

The derivative calculating section 94 calculates a derivative value of the voltage measured by the voltage measuring section 93. The current calculating section 95 calculates the charge/discharge current of the intermediate capacitor 50 based on the derivative value calculated by the derivative calculating section 94. The current calculating section 95 may set the current value of the charge/discharge current of the intermediate capacitor 50 to be the derivative value of the voltage measured by the voltage measuring section 93. With this configuration, the charge/discharge current measuring section 90 can measure the charge/discharge current of the intermediate capacitor 50 without using the second detection resistor 91.

Figure 11:
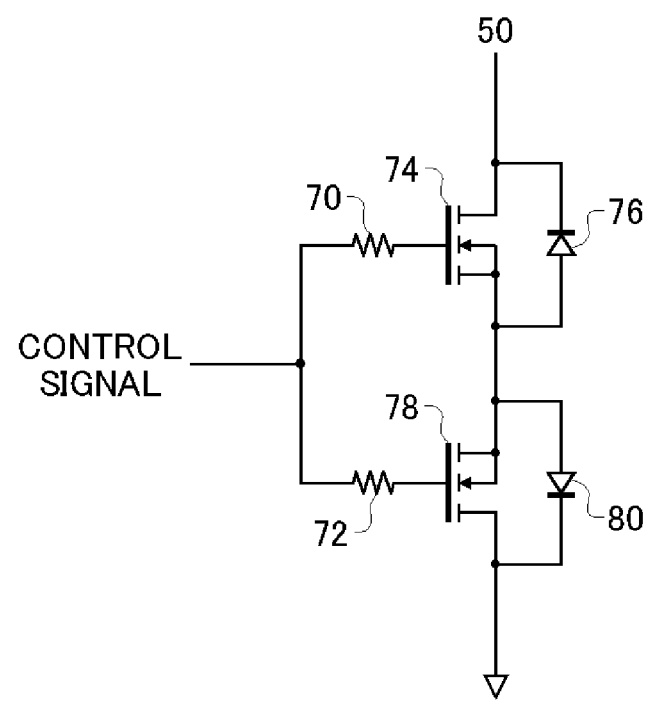
FIG. 11 shows an exemplary configuration of the switch 52.

FIG. 11 shows an exemplary configuration of the switch 52. The switch 52 includes a transistor 74, a transistor 78, a diode 76, a diode 80, a resistor 70, and a resistor 72. The transistor 74 and the transistor 78 are arranged in series between the intermediate capacitor 50 and the ground potential. The transistor 74 and the transistor 78 receive a control signal in parallel via the resistor 70 and the resistor 72. The transistor 74 and the transistor 78 may have the same polarity.

The diode 76 is a parasitic diode that is formed between the source and drain of the transistor 74. The diode 80 is a parasitic diode that is formed between the source and drain of the transistor 78. In the present embodiment, the diode 76 is oriented in a forward direction from the ground potential toward the intermediate capacitor 50, and the diode 80 is oriented in a reverse direction from the intermediate capacitor 50 to the ground potential.

When the control voltage is level H, the intermediate capacitor 50 is connected to the ground potential via the transistor 74 and the transistor 78. When the control voltage is level L, each transistor is OFF and each diode has a reverse connection such that current does not flow, and so the intermediate capacitor 50 is disconnected from the ground potential. With this configuration, the switch 52 can be formed to be small and to have low power consumption.

Figure 12:
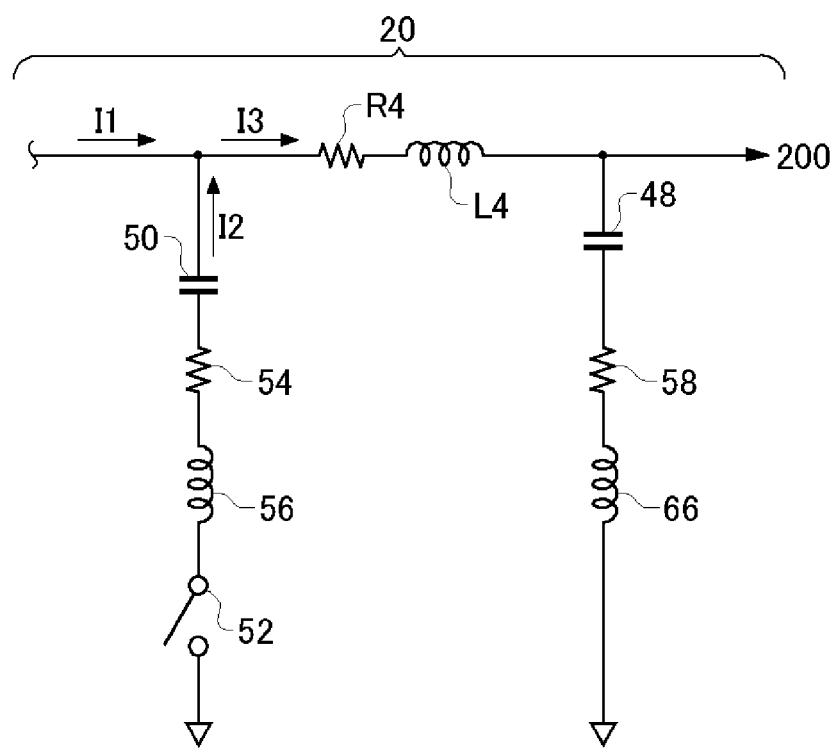
FIG. 12 shows another exemplary configuration of a circuit for measuring the current flowing through the transmission path 20.

FIG. 12 shows another exemplary configuration of a circuit for measuring the current flowing through the transmission path 20. In FIG. 12, only a portion of this circuit is shown. The test apparatus 100 of the present embodiment further includes a damping resistor 54, in addition to the configuration described in FIG. 2. The damping resistor 54 may function as the second detection resistor 91. The inductor 56 represents the inductance component in series with the intermediate capacitor 50 and located between the transmission path 20 and the ground potential. The inductor 66 and the resistor 58 represent the inductance component and the resistance component that are in series with the low-capacitance capacitor 48 and located between the transmission path 20 and the ground potential.

The system that connects the intermediate capacitor 50 to the low-capacitance capacitor 48 is formed by a series resonant circuit. As a result, the current flowing between the intermediate capacitor 50 and the low-capacitance capacitor 48 is resonated. Therefore, the test apparatus 100 of the present embodiment includes the damping resistor 54 to decrease the current resonance.

The damping resistor 54 is connected in series with the intermediate capacitor 50, between the transmission path 20 and the ground potential, and has a resistance value corresponding to the capacitance values of the intermediate capacitor 50 and the low-capacitance capacitor 48. More specifically, the damping resistor 54 is set according to the impedance in the resonance frequency of the composite inductance component L and the composite capacitance component C of the series resonant circuit.

The resonance frequency of this series resonant circuit can be calculated based on the composite inductance component L and the composite capacitance component C of this circuit, using the expression $1/(2\pi \times (LC)^{0.5})$. The resistance value of the damping resistor 54 may be determined according to the impedance of the composite inductance component L and the composite capacitance component C of the resonance frequency. The inductance of the resonance frequency is $(L/C)^{0.5}$. The resistance value of the damping resistor 54 may be set such that the composite resistance value of the series resonant circuit is $2 \times (L/C)^{0.5}$.

Figure 13:
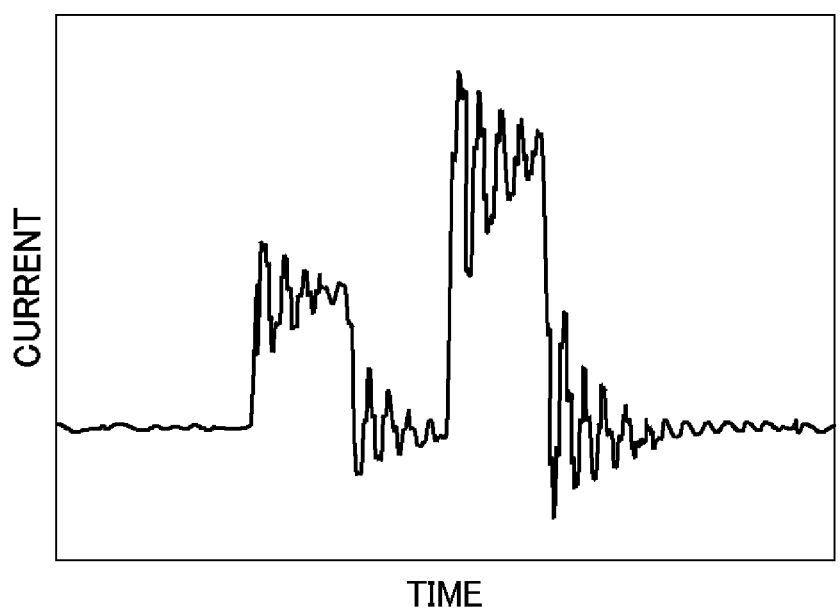
FIG. 13 shows the current flowing through the device under test 200 when the damping resistor 54 has a resistance value approximately equal to that of the resistor 58.

FIG. 13 shows the current flowing through the resistance component R4 in the current path to the device under test 200 when the damping resistor 54 has a resistance value approximately equal to that of the resistor 58. In the present embodiment, the inductance component L4, the inductance of the inductor 56, and the inductance of the inductor 66 are each set to 0.5 nH, the capacitance of the intermediate capacitor 50 is set to the capacitance of the low-capacitance capacitor 48 is set to 0.2 µF, the resistance value of the resistance R4 is set to 2 mΩ, and the resistance values of the damping resistor 54 and the resistor 58 are each set to 5 mΩ. In this case, a large resonance component is included in the current flowing through the intermediate capacitor 50 and the low-capacitance capacitor 48.

Figure 14:
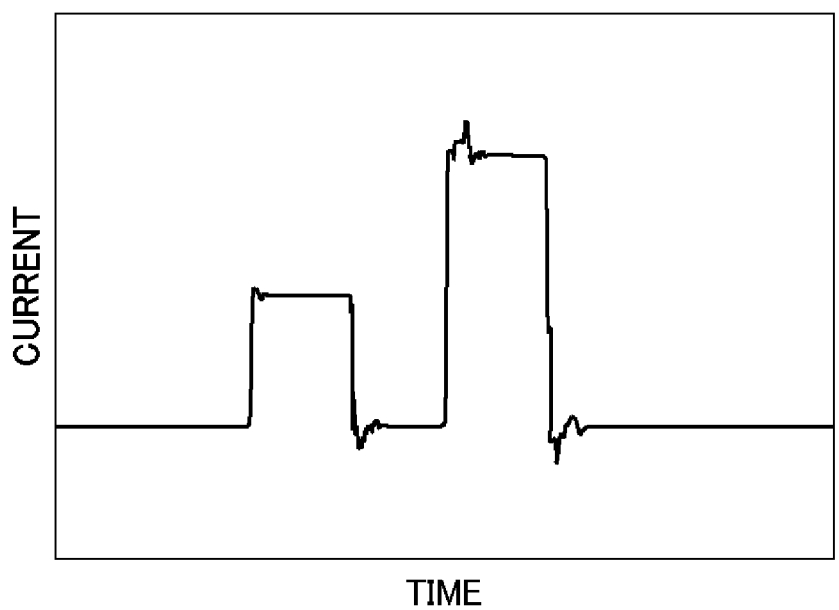
FIG. 14 shows the current flowing through the device under test 200 when the damping resistor 54 has a resistance value that is 20 times greater than that of the resistor 58.

FIG. 14 shows the current flowing through the resistance component R4 in the current path to the device under test 200 when the damping resistor 54 has a resistance value that is 20 times greater than that of the resistor 58. The characteristic values of the elements in the present embodiment are the same as those described in FIG. 13, except that the resistance value of the damping resistor 54 is 85 mΩ. As shown in FIG. 14, the damping resistor 54 can decrease the resonance component of the current flowing through the device under test 200. The damping resistor 54 may have a resistance value grater than that of the resistor 58.

Figure 15:
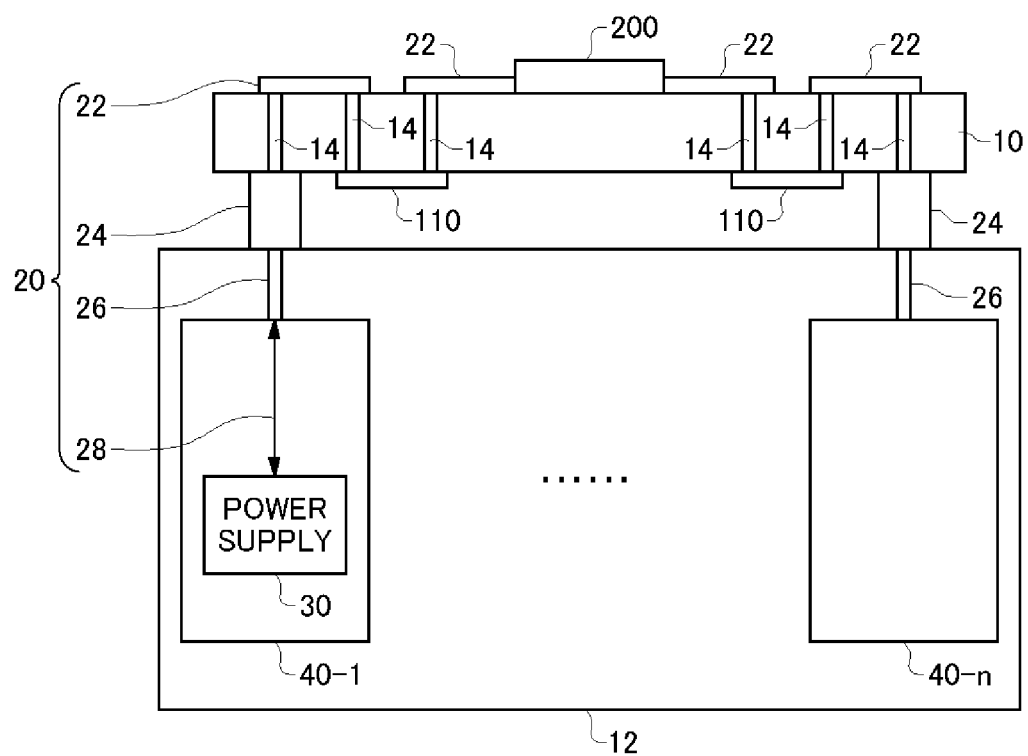
FIG. 15 shows another exemplary configuration of the test apparatus 100.

FIG. 15 shows another exemplary configuration of the test apparatus 100. The test apparatus 100 of the present embodiment further includes an additional circuit 110 in addition to the configuration of the test apparatus 100 described in relation to FIG. 1. The additional circuit 110 includes a portion of the circuit described in relation to FIG. 2, and is fixed to the test board 10.

The additional circuit 110 may be electrically connected to the board wiring 22 on the test board 10. The additional circuit 110 may be fixed to a back side of the surface of the test board 10 onto which the device under test 200 is placed. The additional circuit 110 may be electrically connected, via the via wiring 14, to the board wiring 22 provided on the front surface of the test board 10. The via wiring 14 penetrates from the front surface to the back surface of the test board 10.

The additional circuit 110 may include a portion of the transmission path 20. In this case, the board wiring 22 of the test board 10 and the transmission path 20 of the additional circuit 110 are connected in series. For example, the board wiring 22 may be provided on the test board 10 with portions thereof disconnected from each other, and additional circuits 110 may be connected in series between the disconnected portions.

Figure 16:
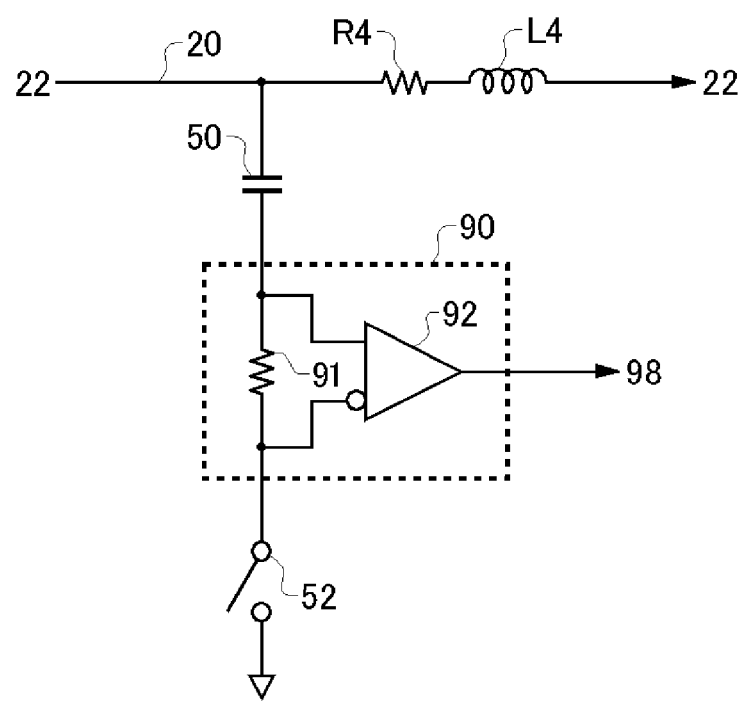
FIG. 16 shows a configuration of the additional circuit 110.

FIG. 16 shows a configuration of the additional circuit 110. The additional circuit 110 of the present embodiment includes a portion of the transmission path 20, the intermediate capacitor 50, the charge/discharge current measuring section 90, and the switch 52. The ends of the transmission path 20 in the additional circuit 110 are electrically connected to the board wiring 22 via the via wiring 14, such that the transmission path 20 is inserted between the disconnected portions of the board wiring 22.

The intermediate capacitor 50, the charge/discharge current measuring section 90, and the switch 52 are the same as the intermediate capacitor 50, the charge/discharge current measuring section 90, and the switch 52 described in relation to FIG. 2. The charge/discharge current measuring section 90 notifies the load current calculating section 98 provided in the test module 40 concerning the measured current I2.

By adding this additional circuit 110 to a test apparatus that does not include the intermediate capacitor 50 or the charge/discharge current measuring section 90, the test apparatus can function as the test apparatus 100 described in relation to FIGS. 1 to 16. Attachment of additional circuits 110 can be achieved simply by disconnecting portions of the board wiring 22 and electrically inserting the additional circuits 110 between the disconnected portions, in the manner described above.

The configuration of the additional circuit 110 is not limited to the configuration shown in FIG. 16. The additional circuit 110 may include one or more of the configurational elements shown in FIG. 2. More specifically, the additional circuit 110 may further include one or more of the power supply current measuring section 60, the mid-speed current supply section 49, and the low-capacitance capacitor 48.

The test board 10 may include the configuration shown in FIG. 16. For example, the test board 10 may include a portion of the transmission path 20, the intermediate capacitor 50, the charge/discharge current measuring section 90, and the switch 52. The test board 10 may include one or more of the power supply current measuring section 60, the mid-speed current supply section 49, and the low-capacitance capacitor 48.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a power supply that generates power supplied to the device under test;
    a transmission path that transmits the power generated by the power supply to the device under test;
    a current measuring section that measures a peak in current supplied to the device under test via the transmission path, the peak including a frequency component higher than a frequency corresponding to a product of an inductance component from the power supply to the device under test and a capacitance component between the transmission path and a ground potential; and
    a judging section that judges acceptability of the device under test based on the peak.

2. The test apparatus according to claim 1, wherein the current measuring section includes an intermediate capacitor provided between the transmission path and the ground potential, a charge/discharge current measuring section that measures charge/discharge current of the intermediate capacitor, and a load current calculating section that calculates a load current supplied to the device under test based on the charge/discharge current.

3. The test apparatus according to claim 2, wherein the current measuring section further includes a power supply current measuring section that measures a Dower supply current flowing though the transmission path on a power supply side of the intermediate capacitor, and the load current calculating section calculates the load current based on a sum of the power supply current and the charge/discharge current.

4. The test apparatus according to claim 3, wherein the current measuring section mc odes a peak detecting section that detects the peak based on whether the sum of the power supply current and the charge/discharge current exceeds a predetermined threshold value.

5. The test apparatus according to claim 4, wherein the judging section judges the acceptability of the device under test based on a number of peaks detected by the peak detecting section within a predetermined measurement period.

6. The test apparatus according to claim 5, wherein the judging, section judges acceptability of the device under test based further on a maximum level of the number of peaks detected by the peak detecting section.

7. The test apparatus according to claim 6, wherein the current measuring section includes a threshold value generating section that generates a plurality of predetermined threshold values, an offset adding section that adds an offset value to each of the threshold values generated by the threshold value generating section, a level comparing section that compares the peaks to the plurality of values obtained as a result of adding the offset value to each of the threshold values; and a range control section that controls a measurement range over which the levels of the peaks are measured, by controlling the offset value of the offset adding section.

8. The test apparatus according to claim 4, wherein the judging section judges acceptability of the device under test based on a time interval between peaks detected by the peak detecting section.

9. The test apparatus according to claim 4, wherein the peak detecting section determines the threshold value according to an average value, over a predetermined period, of the sum of the power supply current and the charge/discharge current.

10. The test apparatus according to claim 3, further comprising a high-capacitance capacitor that has a higher capacitance than the intermediate capacitor and that is provided between the ground potential and the transmission path at a position closer to the power supply than the intermediate capacitor.

11. The test apparatus according to claim 10, further comprising a low-capacitance capacitor that has a lower capacitance than the intermediate capacitor and that is provided between the ground potential and the transmission path at a position closer to the device under test than the intermediate capacitor.

12. The test apparatus according to claim 11, wherein the load current calculating section calculates a current flowing through the device wider test and the low-capacitance capacitor based on the sum of the current measured by the power supply current and the charge/discharge current.

13. The test apparatus according, to claim 11, wherein the intermediate capacitor is connected to the transmission path closer to the low-capacitance capacitor than the high-capacitance capacitor.

14. The test apparatus according to claim 13, further comprising a test board that contacts the device under test, wherein the low-capacitance capacitor and the intermediate capacitor are provided on the test board.

15. The test apparatus according to claim 14, further comprising a connector that is provided on the transmission path and that electrically connects the test board to the power supply, wherein the high-capacitance capacitor is connected to the transmission path on the power supply side of the connector.

16. The test apparatus according to claim 15,
    wherein the power supply current measuring section includes a first detection resistor that is provided on the transmission path on the power supply side of the connector, and a first potential difference detecting section that detects a potential difference between ends of the first detection resistor; and wherein the charge/discharge current measuring section includes a second detection resistor that is provided between the intermediate capacitor and the ground potential, and a second potential difference detecting section that detects a potential difference between ends of the second detection resistor.

17. The test apparatus according to claim 16, further comprising:

a setting section that sequentially :changes a set gain for the second potential difference detecting section among a plurality of gain values, and that sets an amplifier at the gain value that results in the maximum peak level;

wherein the second potential difference detecting section is the amplifier that amplifies the potential difference between ends of the second detection resistor by the set gain.

18. The test apparatus according to claim 11, further comprising a damping resistor that is provided in series with the intermediate capacitor between the transmission path and the ground potential and that has a larger resistance value than a resistance component in series with the low-capacitance capacitor between the transmission path and the ground potential.

19. An additional circuit that is used in a test apparatus for testing a device under test, the test apparatus including a power supply that generates power supplied to the device under test, a transmission path that transmits the power generated by the power supply to the device under test; test and a judging section that judges acceptability of the device under test based on a peak in current supplied to the device under test, the additional circuit comprising:

a peak measuring section operable to measure the peak in the current supplied to the device under test via the transmission path, the peak including a frequency component higher than a frequency corresponding to a product of an inductance component from the power supply to the device under test and a capacitance component between the transmission path and a ground potential, and notify the judging section concerning the measured peak.

20. A test board that is used in a test apparatus for testing a device under test, comprising:

a transmission path that transmits power generated by a power supply, which is provided in a test apparatus, to the device under test; and a peak measuring section operable to measure a peak in current supplied to the device under test via the transmission path, the peak including a frequency component higher than a frequency corresponding to a product of an inductance component between the power supply and the device under test and a capacitance component between the transmission path and a ground potential, and notify a judging section provided the test apparatus concerning the measured peak.

* * * * *